United States Patent [19]
Takeuchi et al.

[11] Patent Number: 4,490,641
[45] Date of Patent: Dec. 25, 1984

[54] THREE ELECTRODE PIEZOELECTRIC CERAMIC RESONATOR

[75] Inventors: Hiroshi Takeuchi, Matsudo; Shigeru Jyo mura; Kazuyuki Nagatsuma, both of Hachioji; Mitsutaka Hikita; Yukio Ito, both of Kokubunji; Sakichi Ashida, Fuchu, all of Japan

[73] Assignee: Hitachi, Ltd., Tokyo, Japan

[21] Appl. No.: 278,729

[22] Filed: Jun. 29, 1981

[30] Foreign Application Priority Data

Jun. 27, 1980 [JP] Japan ............... 55-86623
Oct. 17, 1980 [JP] Japan ............... 144388

[51] Int. Cl.$^3$ .................... H01L 41/08
[52] U.S. Cl. ............... 310/366; 310/358; 310/348
[58] Field of Search ............... 310/365-368, 310/357, 358, 348, 370

[56] References Cited

U.S. PATENT DOCUMENTS

| | | | |
|---|---|---|---|
| 3,432,773 | 3/1969 | Land et al. | 310/358 X |
| 3,624,564 | 11/1971 | Ise | 310/368 X |
| 3,683,213 | 8/1972 | Staudte | 310/370 X |
| 3,764,848 | 10/1973 | Berlincourt | 310/358 X |
| 4,303,908 | 12/1981 | Enemark et al. | 310/366 X |
| 4,336,510 | 6/1982 | Miyamori | 310/366 X |
| 4,370,583 | 1/1983 | Ljung | 310/366 X |

FOREIGN PATENT DOCUMENTS

| | | | |
|---|---|---|---|
| 2915019 | 10/1979 | Fed. Rep. of Germany | 310/366 |
| 0013806 | 1/1982 | Japan | 310/366 |

Primary Examiner—Mark O. Budd
Attorney, Agent, or Firm—Antonelli, Terry & Wands

[57] ABSTRACT

The piezoelectric resonator of this invention consists of a piezoelectric ceramic plate which is polarized in the direction of thickness over the entire plate, two split electrodes are formed on one main surface of the piezoelectric ceramic plate, and an electrode is formed on the entire main surface opposed to the above main surface on which are formed the split electrodes. When an operating voltage is supplied to the above two split electrodes, the piezoelectric ceramic plate between the two split electrodes and the other electrode undergoes resonance in a thickness dilatational mode with a phase difference of 180°.

16 Claims, 18 Drawing Figures

THREE ELECTRODE PIEZOELECTRIC CERAMIC RESONATOR

BACKGROUND OF THE INVENTION

The present invention relates to a piezoelectric resonator employing a piezoelectric ceramic material, and more specifically to a piezoelectric resonator which can be used as an oscillator for electronic timekeeping devices and communications systems, or which can be used as an ultrasonic device for ME systems.

The piezoelectric resonator consists of a piezoelectric plate with metal electrodes formed on both surfaces, and works based upon the principle of interconversion between electric vibration and mechanical vibration.

So far, the piezoelectric plate used for the piezoelectric resonators has been made of a ceramic material of the so-called PZT type consisting of lead zirco-titanate $(Pb(Zr_{1-x}Ti_x)O_3)$ as a main component, or piezoelectric quartz crystals. The PZT-type ceramics, however, have high dielectric constants, and input/output impedances become very low when they are used under high-frequency conditions, presenting a problem of impedance matching with the external circuits. In particular, it is the modern tendency to use the piezoelectric resonators under high-frequency conditions, and it has been desired to develop piezoelectric resonators having better temperature characteristics and resonance properties so that they can be used under high-frequency conditions. As a promising example of the piezoelectric material of a resonator for use under high-frequency and high-temperature conditions, attention has been given to a ceramic material of the type of lead titanate $(PbTiO_3)$ composed chiefly of lead oxide (PbO) and titanium oxide $(TiO_2)$ owing to its low dielectric constant and high Curie temperature. In recent years, it has been discovered that poor temperature characteristics inherent in the $PbTiO_3$-type ceramics can be greatly improved by the addition of neodymium oxide $Nd_2O_3$, manganese oxide $MnO_2$ and the like (U.S. Pat. No. 4,243,541). This fact brings about the probability that the $PbTiO_3$-type ceramics will find extended fields of applications. Due to its small Poisson ratio, however, the $PbTiO_3$-type ceramics are not capable of trapping the vibration energy by lowering the frequency beneath a portion of the electrode, unlike the PZT-type ceramics. When used as a resonator or a filter based upon the thickness dilatational mode over a frequency range of several megahertz to several tens of megahertz, therefore, the $PbTiO_3$-type ceramics generate spurious signals and thus make it difficult to obtain a high Q value. In recent years, a variety of methods have been proposed to realize trapping of the vibration energy by increasing the frequency in order to improve the resonance properties of the $PbTiO_3$-type ceramics. However, these ceramic resonators have yet to be put into use.

SUMMARY OF THE INVENTION

The present invention was accomplished in view of the abovementioned aspects, and its object is to provide a piezoelectric resonator which is simply constructed and which has excellent resonance properties over a frequency range of from several megahertz to several tens of megahertz. In particular, the present invention is to provide a thickness dilatational resonator which is capable of preventing the resonance properties from being deteriorated by spurious signals even when a piezoelectric plate having a small Poisson ratio, such as a $PbTiO_3$-type ceramic is used. The resonator of the present invention works based upon a principle in which spurious signals caused by undesired vibrations are cancelled by each other since the piezoelectric ceramic plate is allowed to resonate in an antisymmetric thickness dilatational mode having phases 180° a part. Namely, the present invention relates to a piezoelectric resonator which consists of a piezoelectric ceramic plate that is polarized uniformly in the direction of thickness, and electrodes which are formed on both surfaces of the piezoelectric ceramic plate, the electrode formed on one surface of the piezoelectric ceramic plate being divided into two split electrodes, wherein the piezoelectric ceramic plate undergoes resonance beneath the split electrodes in a thickness dilatational mode with a phase difference of 180°.

DESCRIPTION OF THE PREFERRED EMBODIMENTS

The invention will now be explained below in detail with reference to the drawings.

Figure 1A:
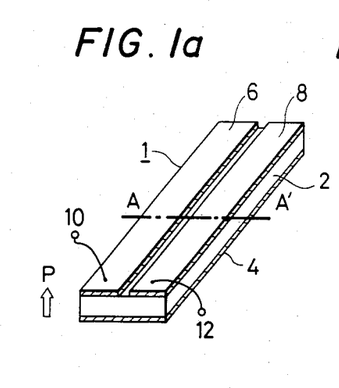
FIG. 1(a) is a view illustrating the setup of a piezoelectric resonator according to an embodiment of the present invention.
Figure 1B:
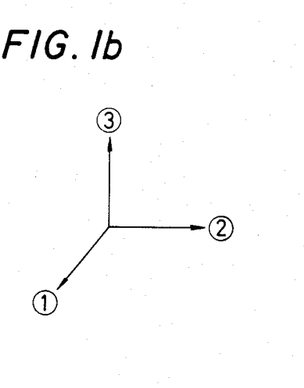
FIG. 1(b) is a diagram illustrating the length, width and thickness directions of the resonator.

FIG. 1(a) is a view illustrating the setup according to an embodiment of the present invention. A piezoelectric resonator 1 according to the present invention consists of a rectangular piezoelectric ceramic plate 2 and electrodes 4, 6 and 8 formed on the two main surfaces of the piezoelectric ceramic plate 2. Referring to FIG. 1(b), the rectangular piezoelectric ceramic plate 2 has a length, a width and a thickness that are represented by direction ①, direction ②, and direction ③. The piezoelectric ceramic plate 2 is polarized in the direction of arrow P (direction ③). The solid electrode 4 is formed on either one of the two opposing main surfaces (planes perpendicular to the polarizing direction P) of the piezoelectric ceramic plate 2, and the two electrodes 6 and 8 formed on the other main surface are symmetrically divided into two relative to the center line in the lengthwise direction (direction ① of the ceramic plate 2. Reference numerals 10 and 12 denote electric terminals that are drawn from the split electrodes 6 and 8. Further, the whole surface of electrode 4 of the resonator 1 of the present invention may be grounded, as required.

Figure 2A:
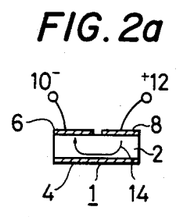
FIGS. 2(a), 2(b), 2(c) and 2(d) are diagrams illustrating the operation principle of a resonator of the present invention.
Figures 2B, 2C:
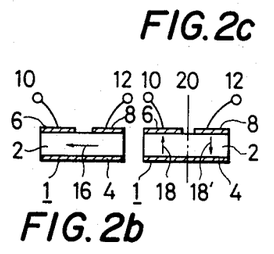
Figure 2D:
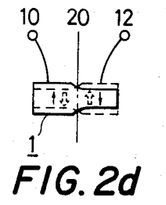

The operation of the piezoelectric resonator 1 of the present invention will be illustrated below with reference to FIGS. 2(a) to 2(d). Here, FIG. 2 is a section view taken along the line A—A' of FIG. 1(a). If a negative voltage is applied to the terminal 10 and a positive voltage to the terminal 12, an electric field distribution 14 develops in the ceramic plate 2 as shown in FIG. 2(a) due to the presence of the electrode 4 on the other surface. The electric field distribution 14 can be divided into a component 16 which is perpendicular to the polarizing direction and components 18, 18' parallel with the polarizing direction as shown in FIGS. 2(b) and 2(c). When a PbTiO$_3$-type ceramic material is used for the piezoelectric ceramic plate 2, excellent piezoelectric coupling is obtained relative to electric field components 18, 18' in the polarizing direction, since the PbTiO$_3$-type ceramic plate exhibits an electromechanical coupling factor in the polarizing direction about 10 times greater than the electromechanical coupling factor in the directions at right angles to the polarizing direction. Moreover, the directions of the electric field components 18, 18' are opposite (the phases are by 180° apart) on both sides of the center line 20 of the ceramic plate. Therefore, when an alternating electric field is applied across the terminals 10 and 12, the thickness dilatational vibrations which are coupled with the electric field components 18, 18' in the polarized direction are excited. Moreover, the thickness dilatational vibrations are excited in the antisymmetrical mode relative to the center line 20 as shown in FIG. 2(d) (in which electrodes 4, 6 and 8 are not drawn to simplify the diagram). Namely, when a negative voltage is applied to the terminal 10 and a positive voltage to the terminal 12, the portion sandwiched between the electrodes 4 and 6 is expanded in the direction of thickness (direction ③) as indicated by the solid lines in FIG. 2(d), and the portion sandwiched between the electrodes 4 and 8 is contracted in the direction of thickness since the direction of electric field is opposite thereto. On the other hand, when a positive voltage is applied to terminal 10 and a negative voltage to terminal 12, the portion sandwiched between the electrodes 4 and 6 is contracted in the direction of thickness, and the portion sandwiched between the electrodes 4 and 8 is expanded in the direction of thickness, as indicated by dotted lines in FIG. 2(d). Therefore, spurious signals caused by undesired vibrations with a single striplike thickness dilatational resonator are cancelled by each other. That is, it is possible to increase the Q value while decreasing or eliminating undesired vibrations even when a piezoelectric plate having a small Poisson ratio, such as a PbTiO$_3$-type ceramic material, is used.

Figure 3:
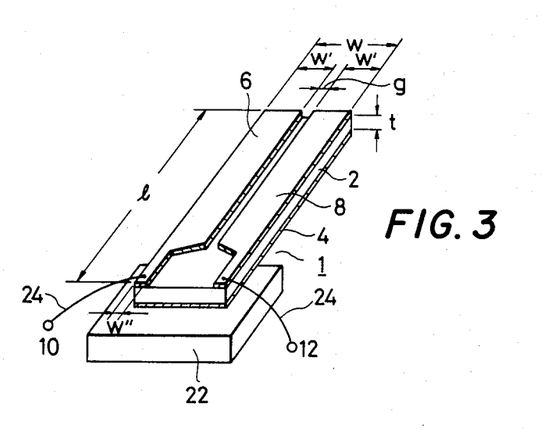
FIG. 3 is a view illustrating a method of supporting the resonator of the present invention.

Next, a method of supporting the resonator 1 of the present invention is described. Referring to FIG. 3, the length of the rectangular plate 2 is selected to be sufficiently greater than the thickness t or the width w, and an end portion on the side of the electrode 4 in the lengthwise direction is secured to a support plate 22. In the split electrodes 6 and 8, the portions opposed to the support plate (support portions) have a width w" that is narrower than the width w' of the remaining portions (resonating portions). Lead wires 24 are connected to these narrow portions to form the electric terminals 10, 12 to maintain the high Q value. In FIG. 3, symbol g denotes a gap width between the split electrodes. In FIG. 3, furthermore, the electrode 4 is formed on the whole surface of the other main surface of the ceramic plate 2; the electrode may be not, however, formed on the portion that comes into contact with the support plate 22, or the support plate 22 may be made of an electrically conductive material, and the electrode 4 may be grounded via the support plate 22.

Piezoelectric resonators of this invention using the PbTiO$_3$-type ceramic material was tested. Resonators of various sizes (Examples 1-28 in Table 1) were obtained from a ceramic plate that was prepared by sintering a PbTiO$_3$-type ceramic containing neodymium Nd, indium In, and manganese Mn and which exhibited a small resonant frequency temperature coefficient relative to the thickness dilatational mode, followed by the polarization treatment at 55 KV/cm in the direction of thickness for 10 minutes (at 150° C.).

In Table 1, symbols l and t denote the length and thickness of the rectangular ceramic plate, and w' denotes the width of the resonating portions of the split electrodes. The gap width g between the split electrodes is 0.2 mm, and the width w" of the supporting portion of the split electrodes is 0.3 mm. Therefore, the width w of the ceramic plate is (2w'+0.2) mm.

Figure 4:
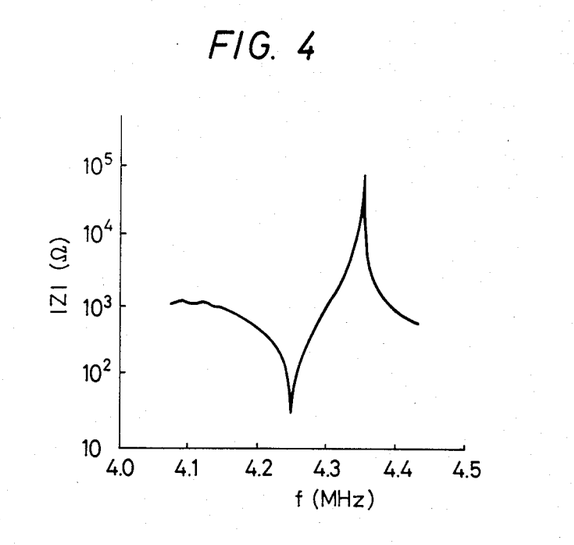
FIG. 4 is a graph illustrating the resonance properties of the resonator of the present invention.

The electrodes are formed by vaporizing electrode-forming materials (chromium and gold) directly onto the ceramic plate through a metal mask. Table 1 shows resonant frequencies f$_o$ of the resonators, equivalent resistances R, and Q values during the resonance. These values are measured by supporting the end portion of the resonator on the support plate as illustrated in to FIG. 3. According to the present invention, as will be obvious from Table 1, piezoelectric resonators having sufficiently high Q values are obtained. For instance, resonance characteristics of an Example 18 (w'=0.8 mm, l=6 mm, t=0.54 mm) are shown in FIG. 4, in which the ordinate represents the absolute value of the impedance |Z| (ohms) of the resonator and the abscissa represents the frequency f (MHz). The resonant frequency f$_o$ is about 4.25 MHz, from which it is apparent that the resonator exhibits single resonance characteristics with very few spurious signals. Furthermore, the Q value is as great as about 2200, as determined from an admittance circle in the vicinity of the resonant point.

TABLE 1

| | Size of resonator (mm) | | | Resonant frequency | Resonant resistance | |
|---|---|---|---|---|---|---|
| | l | w' | t | f$_o$ (MHz) | R (Ω) | Q |
| Ex. 1 | 4 | 0.5 | 0.38 | 6.076 | 320 | 380 |
| Ex. 2 | | | 0.45 | 5.141 | 450 | 280 |
| Ex. | | 0.7 | 0.38 | 6.067 | 170 | 480 |

TABLE 1-continued

| | Size of resonator (mm) | | | Resonant frequency | Resonant resistance | |
|---|---|---|---|---|---|---|
| | l | w' | t | $f_o$ (MHz) | R (Ω) | Q |
| Ex. 3 | | | 0.45 | 5.132 | 335 | 390 |
| Ex. 4 | | 0.8 | 0.45 | 5.122 | 370 | 290 |
| Ex. 5 | | | 0.54 | 4.308 | 400 | 240 |
| Ex. 6 | | 1.0 | 0.45 | 5.115 | 725 | 105 |
| Ex. 7 | | | 0.54 | 4.320 | 890 | 85 |
| Ex. 8 | 5 | 0.5 | 0.38 | 6.064 | 235 | 540 |
| Ex. 9 | | | 0.53 | 4.363 | 350 | 380 |
| Ex. 10 | | 0.8 | 0.38 | 6.052 | 165 | 710 |
| Ex. 11 | | | 0.53 | 4.350 | 210 | 520 |
| Ex. 12 | 6 | 0.5 | 0.38 | 6.010 | 95 | 930 |
| Ex. 13 | | | 0.45 | 5.121 | 115 | 780 |
| Ex. 14 | 6 | 0.5 | 0.90 | 2.631 | 375 | 310 |
| Ex. 15 | | | 1.10 | 2.183 | 620 | 125 |
| Ex. 16 | | 0.8 | 0.43 | 5.322 | 30 | 2370 |
| Ex. 17 | | | 0.54 | 4.251 | 35 | 2220 |
| Ex. 18 | | 0.9 | 0.43 | 5.309 | 35 | 2080 |
| Ex. 19 | | | 0.54 | 4.248 | 40 | 1970 |
| Ex. 20 | | | 0.35 | 6.508 | 56 | 1230 |
| Ex. 21 | | | 0.28 | 8.122 | 85 | — |
| Ex. 22 | 7 | 0.8 | 0.43 | 5.315 | 22 | 2330 |
| Ex. 23 | | | 0.54 | 4.245 | 30 | 2100 |
| Ex. 24 | | 0.9 | 0.43 | 5.303 | 20 | 2840 |
| Ex. 25 | | | 0.54 | 4.244 | 25 | 2900 |
| Ex. 26 | | 1.0 | 0.43 | 5.292 | 28 | 2230 |
| Ex. 27 | | | 0.54 | 4.241 | 35 | 2120 |

Figure 5:
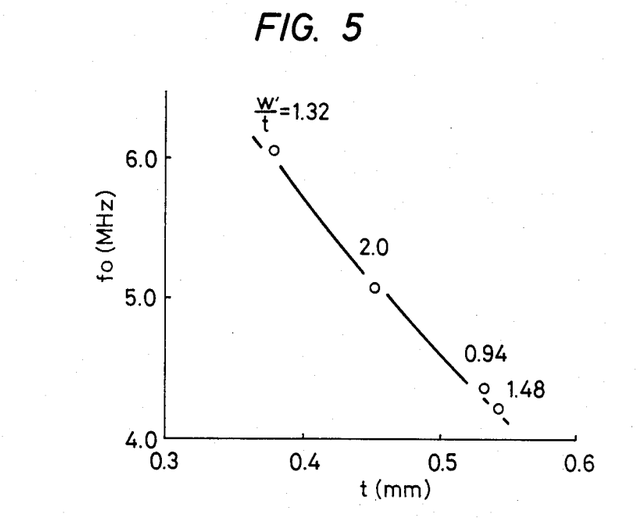
FIG. 5 is a graph illustrating the relation between the thickness t and the resonant frequency $f_o$ of the resonator.

Furthermore, as will be obvious from Table 1, when the thickness t is maintained constant, the equivalent resistance R and the Q value change depending upon the length l and the width w'. The resonant frequency $f_o$, however, is depends only upon the thickness t, and is not affected much by the value of w'. As mentioned above, therefore, it is reasonable to presume that only the thickness dilatational vibration is excited. This fact is also apparent from FIG. 5 which illustrates a relation between the thickness t of a rectangular ceramic plate and the resonant frequency $f_o$ as found from Table 1. In FIG. 5, the ordinate represents the resonant frequency $f_o$, the abscissa represents the thickness t, and numerals attached to the points of measurement denote a ratio w'/t of the width w' of the split electrodes to the thickness t. It will be obvious that the resonant frequency $f_o$ varies in reverse proportion to the thickness t irrespective of the width w' of the split electrode. Therefore, the resonant frequency can be changed by varying the thickness t.

Moreover, there exists a preferred size with regard to the resonator. Namely, when the thickness t is determined depending upon a desired frequency, good characteristics are exhibited when the width w' of the split electrodes and the length l of the resonator lie within the following ranges:

$$0.5\ t \leq w' \leq 3\ t,$$
$$l \geq 5w'$$

For example, as will be understood from Example 16 of Table 1, the Q value drastically decreases when w' becomes smaller than t/2. Furthermore, as will be understood from Example 22, when the width w' becomes greater than 3t, spurious signals start to generate, whereby it becomes difficult to measure the Q value. Referring to Examples 7 and 8, the Q value drastically decreases when the length l of the vibrator becomes smaller than 5w'. When the length l is greater than 5w', good characteristics are exhibited over the ranges of the Examples. However, too great a length l makes it difficult to support the resonator. In practice, therefore, the length l should not be greater than about 30 times the width w'.

Good characteristics are also maintained when the gap width g between the split electrodes satisfies the requirement $g < w'$. From the viewpoint of increasing the Q value, however, the gap width g should be roughly 0.2 w'.

The piezoelectric resonator of the present invention exhibits excellent resonance characteristics without spurious signals even at the third harmonic vibration.

Below is mentioned a piezoelectric ceramic plate material that can suitably be used for the piezoelectric resonator of the present invention. The piezoelectric resonator should possess not only excellent resonance characteristics but also excellent temperature characteristics. Ceramics, in general, possess the advantage that they are move cheaply available than quartz, which has heretofore been employed for piezoelectric resonators. The ceramics, however, have the serious defect of poor temperature characteristics. Some of the inventors of the present invention have previously proposed in U.S. Pat. No. 4,243,541 a piezoelectric ceramic composition having excellent temperature characteristics, which chiefly consists of lead oxide PbO and titanium oxide $TiO_3$ and also contains with neodymium oxide $Nd_2O_3$ and manganese oxide $MnO_2$. Using the above piezoelectric composition, it is possible to obtain a piezoelectric resonator having good temperature characteristics. By using the piezoelectric ceramic composition which will be mentioned below, however, it is possible to obtain a piezoelectric resonator having even better temperature characteristics. Namely, the piezoelectric ceramic plate which can be suitably used for the piezoelectric resonator of the present invention is made of a piezoelectric ceramic composition comprising 43.7 to 46.3 mole % of PbO, 50.4 to 52.6 mole % of $TiO_2$, 1.8 to 3.2 mole % of at least one oxide selected from the group consisting of $Nd_2O_3$, $Sm_2O_3$, $Pr_2O_{11/3}$ and $Ce_2O_4$, and 0.5 to 1.5 mole % of $MnO_2$.

The piezoelectric ceramic material of the above-mentioned composition is encompassed in the compositions which are disclosed in U.S. Pat. No. 4,243,541. The inventors of the present invention, however, have found the fact that when the above-mentioned piezoelectric ceramic composition is employed for the piezoelectric ceramic plate of the piezoelectric resonator of the present invention which is provided with split electrodes and which utilizes the resonances that are antisymmetrical in the direction of the thickness, there exists a relatively narrow composition range in which the resonant frequency temperature coefficient of the resonator becomes extremely small. The above-mentioned composition is specified based upon this discovery. The resonance mode of the piezoelectric resonator of the present invention has properties close to the thickness dilatational vibration of the ceramic plate, and the resonant frequency is determined depending only upon the thickness as mentioned before. The resonant frequency temperature coefficient, however, is slightly different from that of the thickness dilatational vibration, but is inherent in the resonance mode of the present invention.

The piezoelectric ceramic plates will be mentioned below in detail with reference to examples using piezoelectric ceramics having compositions within the aforementioned range.

Figure 6:
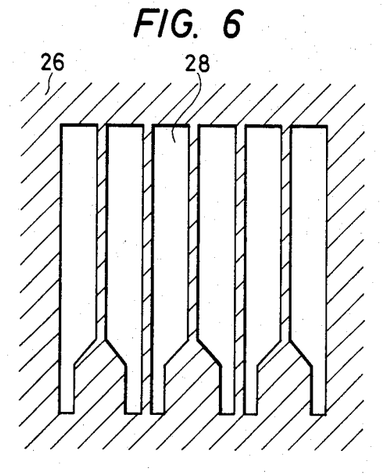
FIG. 6 is a plan view of a mask pattern for vaporizing the electrode, which is employed in the embodiment of the present invention.

Raw materials of ceramics, i.e., PbO, $TiO_2$, $Nd_2O_3$, $Sm_2O_3$, $Pr_6O_{11}$, $CeO_2$ and $MnO_2$ of 99.9% purity were weighed at desired mole ratios as shown in Table 2, mixed in a ball mill for about one hour, and dried. The mixture was sintered at 850° C. for about 2 hours, and pulverized with a pulverizer. The mixture was then molded under 350 kg/cm² pressure to prepare pellets having a diameter of 20 mm and a thickness of 5 mm. The pellets were then sintered at 1260° C. for 5 hours. The thus prepared sintered product measured 16 mm in diameter and 2.5 mm in thickness. Wafers about 0.6 mm thick were formed from the pellets, and coarsely ground. Then a silver paste was baked onto both surfaces for the polarization process. The polarization was effected at of 55 kV/cm for 10 minutes in a silicone oil maintained at a temperature of 150° C. After the silver paste was peeled off, chromium and gold were vaporized onto one surface to thicknesses of 0.01 μm and 0.10 μm, respectively. Further, by using a molybdenum metal mask 26 having a vaporization pattern 28 as shown in FIG. 6, chromium and gold were vaporized onto the other surface in a predetermined pattern to the same thicknesses as mentioned above.

TABLE 2

| | Ceramics composition (mole %) | | Resonant frequency temperature coefficient ($10^{-6}$/°C.) | Q value |
|---|---|---|---|---|
| Ref. Ex. 1 | 46.9 PbO 50.6 $TiO_2$ | 1.5 $Nd_2O_3$ 1.0 $MnO_2$ | −23 | 1500 |
| Ex. 29 | 46.3 PbO 50.9 $TiO_2$ | 1.8 $Nd_2O_3$ 1.0 $MnO_2$ | −9 | 2100 |
| Ex. 30 | 46.3 PbO 50.4 $TiO_2$ | 1.8 $Nd_2O_3$ 1.5 $MnO_2$ | −10 | 2200 |
| Ex. 31 | 45.8 PbO 51.1 $TiO_2$ | 2.1 $Nd_2O_3$ 1.0 $MnO_2$ | 0 | 1800 |
| Ex. 32 | 45.2 PbO 51.4 $TiO_2$ | 2.4 $Nd_2O_3$ 1.0 $MnO_2$ | +10 | 1400 |
| Ref. Ex. 2 | 46.5 PbO 50.2 $TiO_2$ | 1.8 $Nd_2O_3$ 1.5 $MnO_2$ | −15 | 1750 |
| Ex. 33 | 45.2 PbO 51.4 $TiO_2$ | 2.4 $Sm_2O_3$ 1.0 $MnO_2$ | −8 | 1700 |
| Ex. 34 | 44.7 PbO 51.7 $TiO_2$ | 2.6 $Sm_2O_3$ 1.0 $MnO_2$ | −1 | 2150 |
| Ex. 35 | 44.2 PbO 51.9 $TiO_2$ | 2.9 $Sm_2O_3$ 1.0 $MnO_2$ | +10 | 2050 |
| Ex. 36 | 45.2 PbO 51.4 $TiO_2$ | 2.4 $Pr_2O_{11/3}$ 1.0 $MnO_2$ | −7 | 1200 |
| Ex. 37 | 44.7 PbO 51.7 $TiO_2$ | 2.6 $Pr_2O_{11/3}$ 1.0 $MnO_2$ | 0 | 1450 |
| Ex. 38 | 44.2 PbO 51.9 $TiO_2$ | 2.9 $Pr_2O_{11/3}$ 1.0 $MnO_2$ | +8 | 1300 |
| Ex. 39 | 44.2 PbO 51.9 $TiO_2$ | 2.9 $Ce_2O_4$ 1.0 $MnO_2$ | +2 | 1800 |
| Ex. 40 | 43.7 PbO 52.1 $TiO_2$ | 3.2 $Ce_2O_4$ 1.0 $MnO_2$ | +9 | 1250 |
| Ex. 41 | 43.7 PbO 52.6 $TiO_2$ | 3.2 $Ce_2O_4$ 0.5 $MnO_2$ | +10 | 1100 |
| Ref. Ex. 3 | 43.1 PbO 52.5 $TiO_2$ | 3.4 $Ce_2O_4$ 1.0 $MnO_2$ | +23 | 1350 |
| Ref. Ex. 4 | 43.1 PbO 53.0 $TiO_2$ | 3.4 $Ce_2O_4$ 0.5 $MnO_2$ | +26 | 1050 |
| Ex. 42 | 45.2 PbO 51.4 $TiO_2$ | 1.6 $Nd_2O_3$ 0.8 $Sm_2O_3$ 1.0 $MnO_2$ | +1 | 2000 |
| Ex. 43 | 45.2 PbO 51.4 $TiO_2$ | 1.5 $Nd_2O_3$ 0.9 $Pr_2O_{11/3}$ 1.0 $MnO_2$ | −1 | 1850 |
| Ex. 44 | 45.2 PbO 51.4 $TiO_2$ | 1.5 $Nd_2O_3$ 0.5 $Sm_2O_3$ 0.4 $Ce_2O_4$ 1.0 $MnO_2$ | +2 | 1250 |

Figure 7:
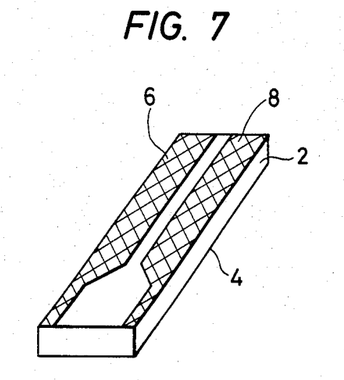
FIG. 7 is a view illustrating the electrode construction of the piezoelectric resonator according to an embodiment of the present invention.
Figure 8:
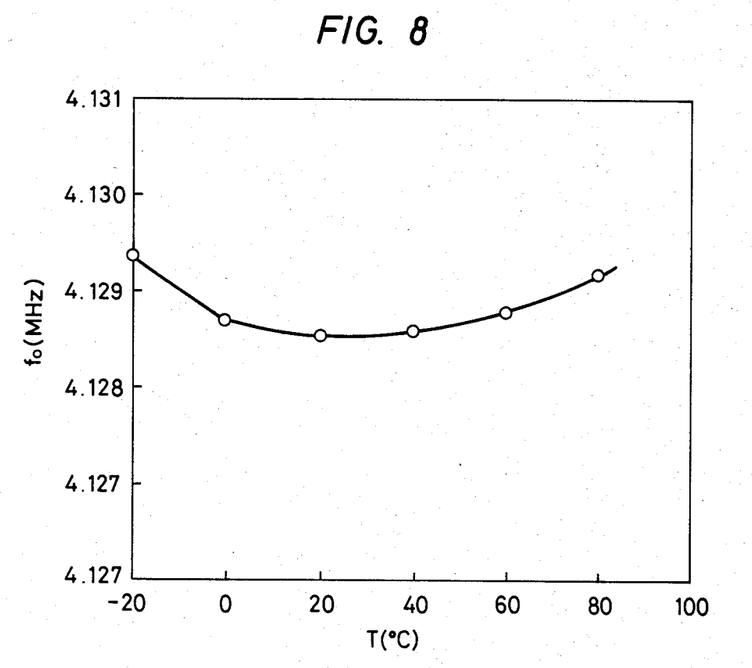
FIG. 8 is a graph showing a relation between the resonant frequency $f_o$ and the temperature T of the piezoelectric resonator according to the embodiment of the present invention.

A piezoelectric resonator having an electrode construction as shown in FIG. 7 was cut out from the wafer on which the electrodes, in the shape of the openings 28 of the pattern, had been vaporized. According to the embodiment of the present invention, the thickness t of the piezoelectric ceramic plate 2 of the resonator was selected to be about 0.54 mm, and the resonant frequency was selected to be about 4 MHz. The piezoelectric resonators 1, prepared by using piezoelectric ceramics of various compositions, were secured at their mounting end to the support plate 22 as shown in FIG. 3 to evaluate their characteristics. Here, the resonators were secured with a silver paste. The sizes l, w', g and w" of the electrodes were selected to be 6.0 mm, 0.8 mm, 0.2 mm and 0.3 mm, respectively. The Q values and the temperature coefficients of resonant frequencies of the piezoelectric resonators are shown in Table 2. As will be obvious from Examples 29 to 41 of Table 2, use of the piezoelectric ceramics comprising 43.7 to 46.3 mole % of PbO, 50.4 to 52.6 mole % of $TiO_2$, 1.8 to 3.2 mole % of $Nd_2O_3$, $Sm_2O_3$, $Pr_2O_{11/3}$ or $Ce_2O_4$, and 0.5 to 1.5 mole % of $MnO_2$, makes the resonant frequency temperature coefficient to be smaller than $10 \times 10^{-6}$/°C. Furthermore, the temperature coefficient can become zero, depending upon the composition. As will be obvious from Examples 42 to 44, furthermore, the same effects are also obtained by the addition of a combination of two or more compounds that are selected from a group of oxides of the aforementioned rare-earth elements. FIG. 8 illustrates the practical change in the resonant frequency depending upon the temperature of Example 31. It will be understood that the temperature coefficient is zero at room temperature (20° C.), and the temperature coefficient is small in the vicinity thereof.

Reference Example 1 stands for the case when the content of PbO is in excess of 46.3 mole % and the amount of rare-earth oxide is smaller than 1.8 mole %, Reference Example 2 stands for the case when the content of $TiO_2$ is smaller than 50.4 mole %, Reference Example 3 stands for the case when the content of PbO is smaller than 43.7 mole % and the amount of rare-earth oxide is greater than 3.2 mole %, and Reference Example 4 stands for the case when the content of $TiO_2$ is greater than 52.6 mole % and the amount of rare-earth oxide is greater than 3.2 mole %. In all of the cases, the resonant frequency temperature coefficient is greater than $10 \times 10^{-6}/°C$. Manganese oxide $MnO_2$ is added in order to increase the Q value of the resonator, and is preferably added in an amount of 0.5 to 1.5 mole %. When $MnO_2$ is added in an amount smaller than 0.5 mole %, the Q value decreases drastically, but when $MnO_2$ is added in an amount greater than 1.5 mole %, the electric resistance is decreased to a point where the polarization treatment becomes difficult.

As mentioned above, it is possible to obtain a piezoelectric resonator having not only excellent resonance characteristics but also a very small frequency temperature coefficient by using a piezoelectric ceramic plate composed of 43.7 to 46.3 mole % of PbO, 50.4 to 52.6 mole % of $TiO_2$, 1.8 to 3.2 mole % of at least one of $Nd_2O_3$, $Sm_2O_3$, $Pr_2O_{11/3}$ or $Ce_2O_4$, and 0.5 to 1.5 mole % of $MnO_2$; polarizing the piezoelectric ceramic plate perpendicularly to the main surface thereof; providing split electrodes; and utilizing the antisymmetrical mode in the direction of the thickness.

Figure 9:
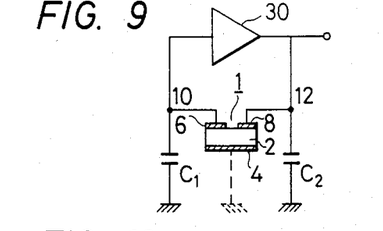
FIG. 9 is a diagram illustrating the setup of an oscillation circuit employing the resonator of the present invention.

FIG. 9 illustrates an example in which the piezoelectric resonator of the present invention is put into practical use. FIG. 9 shows a two-port oscillation circuit in which the piezoelectric resonator 1 of the present invention is connected as shown. In FIG. 9, reference numeral 30 denotes a C-MOS amplifier, and $C_1$ and $C_2$ denote capacitors. The capacitors $C_1$, $C_2$ establish an equivalent load capacitance with respect to the piezoelectric resonator 1. Dotted lines indicate that the whole surface of the electrode 4 may be grounded, as required.

Below is illustrated the method of adjusting the resonant frequency of the piezoelectric resonator of the present invention. The resonant frequency of the piezoelectric resonator is determined depending upon the geometric shape of the resonator. Therefore, if it is attempted to confine the frequency characteristics of the elements within a predetermined range while they are being mass-produced, very strict processing precision is required depending upon the purposes. In practice, however, it is difficult to precisely adjust the frequency to a predetermined value during the processing of the elements. At the present time, therefore, means are employed to adjust the frequency to produce the final products. In dealing with the piezoelectric resonator of the present invention, therefore, it is desired to solve the aforementioned problems.

Figure 10:
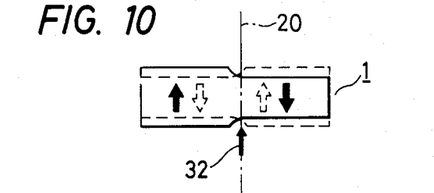
FIGS. 10 and 11 are diagrams illustrating the method of adjusting the frequency of the piezoelectric resonator of the present invention.

According to the piezoelectric resonator of the present invention, the electrode formed on one main surface is divided into two, and a drive voltage is supplied to the thus divided electrodes. Namely, the present invention deals with a thickness dilatational resonator which is excited in the antisymmetrical vibration mode as shown in FIG. 2(d). Therefore, even when a small force 32 is exerted on the center line 20 of the resonator 1 as shown in FIG. 10, the Q value of the resonator 1 is not much affected. That is, it is possible to give strain to the resonator without greatly affecting the Q value. In addition, since the resonator 1 of the present invention is supported at one end portion only as shown in FIG. 3, a great strain can be given to the resonator 1 with a small force if the force is imparted close to the other end portion (free end). The resonant frequency changes depending upon the amount of strain that is given to the resonator. In other words, it is possible to adjust the resonant frequency by controlling the amount of strain.

Figure 11:
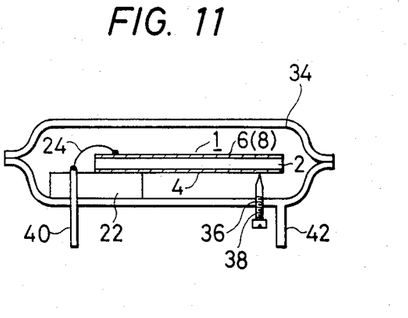

FIG. 11 illustrates another embodiment according to the present invention, which is equipped with means for adjusting the frequency. The piezoelectric resonator 1 of the present invention is disposed in a package 34 made of, for example, steel or nickel via a support member 22. A small hole 36 is formed in the bottom of the package 34, and in the hole 36 is inserted an adjusting screw 38. The tip of the adjusting screw 38 is positioned on or close to the center line near the free end of the resonator. Further, two lead wires 24 of the resonator are connected to pins 40 that are provided in the bottom of the package 34 via an insulator, so that a voltage can be supplied to the split electrodes from a unit on the outside of the package. A ground pin 42 also protrudes from the bottom of the package. By grounding the pin 42, the electrode 4 can be grounded via the support member 22. With the thus constructed piezoelectric resonator of the present invention, strain can be imparted to the resonator 1 by slightly moving the adjusting screw 38. Consequently, the resonant frequency can be adjusted without decreasing the Q value of the resonator 1.

Figure 12:
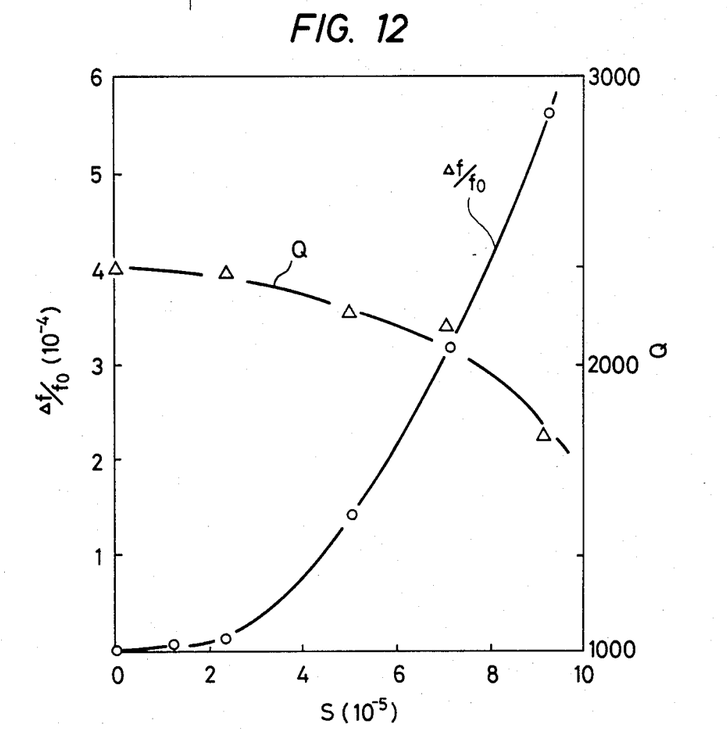
FIG. 12 is a graph showing a relation among the strain S, changing ratio $\Delta f/f_o$ of frequency and Q value.

FIG. 12 is a graph showing a relation between the ratio (changing ratio of the frequency) $\Delta f/f_o$ of the amount of change $\Delta f$ to the resonant frequency $f_o$ when the strain S (calculated from the amount the screw is moved) is imparted to the resonator 1 by the adjusting screw 38, and when no strain is given. As will be obvious from FIG. 12, it is possible to adjust the resonant frequency by about $6 \times 10^{-4}$ by imparting strain in amounts as small as $10^{-5}$ to $10^{-4}$. Moreover, the Q value of the resonator does not change very much. FIG. 12 shows data obtained from a resonator obtained by forming a rectangular plate from a $PbTiO_3$-type ceramic plate which had been polarized in the direction of thickness thereof maintaining a length l of 6 mm, a width w of 2 mm, and a thickness t of 0.53 mm such that the resonant frequency $f_o$ was about 4 MHz, by forming split electrodes of a width w' of 0.9 mm on one main surface of the rectangular plate, and by forming an electrode on the other main surface of the rectangular plate.

According to the embodiment of the present invention as illustrated in the foregoing, it is possible to adjust the resonant frequency by about $6 \times 10^{-4}$ by exerting a small force on the center line of the resonator, without decreasing the Q value.

Furthermore, the piezoelectric resonator of the present invention can be used as a pressure (gas pressure) detector element. According to a gas pressure detecting apparatus employing the piezoelectric resonator, strain is imparted to the resonator by the gas pressure, and the change in the resonant frequency of the resonator caused by the strain is detected. Therefore, the pressure detector element should be capable of yielding large amounts of strain relative to small pressures. The resonator of the present invention works as a thickness dilatational resonator which generates very few spurious signals. Moreover, since the resonator of the present invention is supported at one end portion only, large amounts of strain can be yielded if pressure is imparted to the other end portion (free end). This is based upon the same principle as that of the conventional surface acoustic wave device that is used as the pressure detector element.

Figure 13:
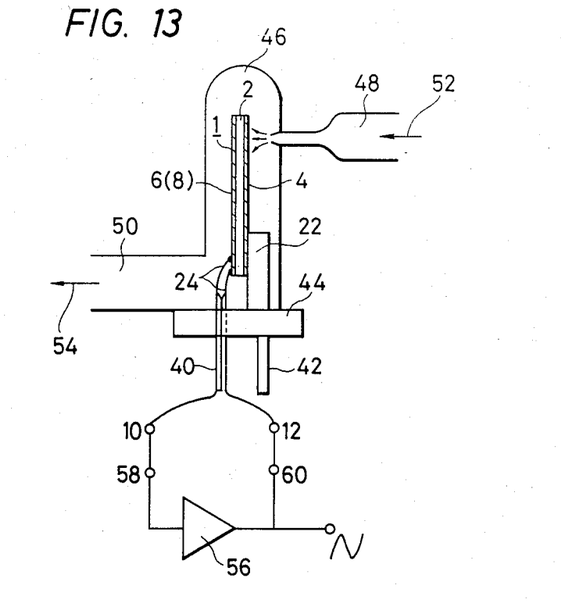
FIG. 13 is a diagram illustrating the setup of a gas-pressure detector employing the resonator of the present invention.

FIG. 13 illustrates the setup of a pressure detecting apparatus employing the piezoelectric resonator of the present invention. The resonator 1 is supported by the support plate 22, secured by a plate 44 made of an electrically conductive material, and is disposed in a container 46 which is made of a cylindrical glass tube of thich one end is closed and the open end is joined to the plate 44. To the side walls of the container 46 are further connected a nozzle 48 and an exhaust duct 50, such that the gas will flow from the nozzle 48 to the exhaust duct 50 through the container 46 as indicated by arrows 52 and 54. The nozzle 48 is installed at such a position that the gas will flow into the vicinity of the free end of the resonator 1 that is disposed in the container 46. As required, furthermore, the diameter of the nozzle 48 is reduced at a portion which connects to the container 46.

Two lead wires 24 of the resonator 1 are connected to pins 40 that are planted in the plate 44 being electrically insulated therefrom, and electric terminals 10, 12 are extended to the outside of the container 46. An earth pin 42 protrudes from the plate 44. By grounding the earth pin 42, the electrode 4 of the resonator 1 can be grounded in the same manner as mentioned with regard to the embodiment of FIG. 11. With the thus constructed setup, the gas streams from the nozzle 48 into the container 46 as indicated by the arrow 52 and imparts pressure to the free end of the resonator 1. The resonator is then strained in accordance with the gas pressure, whereby the resonant frequency undergoes a change (the amount of change of the resonant frequency varies depending upon the gas pressure). Therefore, if the oscillation circuit is set up by connecting the terminals 10 and 12 to terminals 58 and 60 of a C-MOS amplifier 56, the oscillation frequency changes depending upon the gas pressure. Namely, change in the gas pressure can be detected as change in the oscillation frequency.

Figure 14:
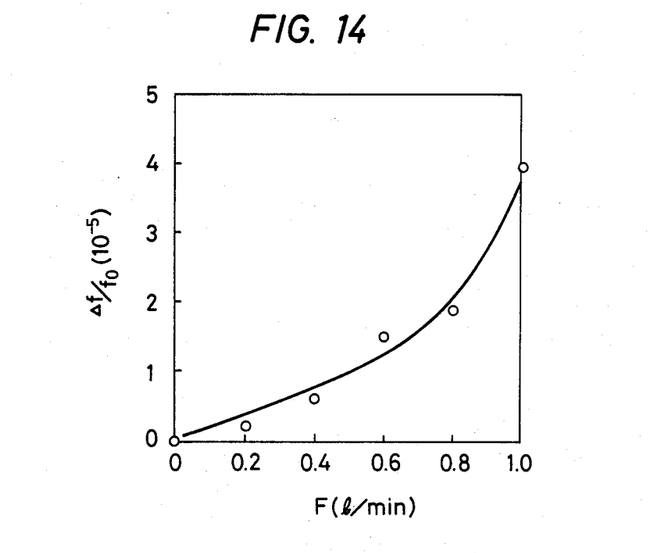
FIG. 14 is a graph illustrating a relation between the gas flow F and the changing ratio $\Delta f/f_o$ of the frequency.

FIG. 14 is a graph illustrating a relation between the flow rate F (i.e., pressure) of the gas and the change ratio $\Delta f/f_o$ of the oscillation frequency. The change ratio $\Delta f/f_o$ of the oscillation frequency increases with the increase in the flow rate F of the gas. Namely, the oscillation frequency changes by about $4 \times 10^{-5}$ ($\Delta f$: 160 Hz) when the flow rate is one liter per minute. FIG. 14 shows data from a case where a resonator was used that had been obtained by forming a rectangular plate from a PbTiO$_3$-type ceramic plate which has been polarized in the direction of thickness thereof maintaining a length l of 8 mm, a width of 3 mm and a thickness t of 0.53 mm such that the resonant frequency was about 4 MHz, by forming split electrodes of a width w' of 1.4 mm on one main surface of the rectangular plate, and by forming the electrode on the other main surface of the rectangular plate.

According to the embodiment of the present invention as mentioned above, the resonator receives the pressure at the free end. Therefore, it is possible to realize a gas-pressure detecting apparatus of high sensitivity.

What is claimed is:

1. A piezoelectric resonator resonating at a resonant frequency greater than 1 MHz comprising: a piezoelectric ceramic plate which is polarized in the same direction in the direction of thickness thereof, electrodes formed on the two opposing main surfaces of said piezoelectric ceramic plate, said electrode formed on one main surface being divided into two split electrodes, and said split electrodes receiving a signal for causing said piezoelectric ceramic plate to resonate beneath said split electrodes in a thickness dilatational mode with a phase difference of 180° at a resonant frequency greater than 1 MHz.

2. A piezoelectric resonator according to claim 1, wherein the electrode opposed to said split electrodes is grounded.

3. A piezoelectric resonator according to claim 1, wherein said piezoelectric ceramic plate is supported by a support member provided at one end thereof, the support member being arranged at the surface which is opposed to the surface where said split electrodes are formed, and where said two split electrodes each have a voltage supply terminal, and said terminals are located on the support member end of said piezoelectric ceramic plate.

4. A piezoelectric resonator according to claim 3, wherein the width of a portion of said terminal of said split electrodes is narrower than the width of other portions.

5. A piezoelectric resonator according to claim 3, wherein the electrode opposed to said split electrodes is formed on the whole surface that is opposed to the surface on which are formed said split electrodes.

6. A piezoelectric resonator according to claim 3, wherein the electrodes opposed to said split electrodes is formed on the whole surface that is opposed to the surface on which are formed said split electrodes, except the portion that is supported by said support member.

7. A piezoelectric resonator according to claim 3 wherein the electrode opposed to said split electrodes is grounded.

8. A piezoelectric resonator according to claim 7, wherein said support member is made of an electrically conductive material, and the electrode opposed to said split electrodes is grounded via said support member.

9. A piezoelectric resonator according to claim 1, wherein the length l and thickness t of said piezoelectric ceramic plate, and the width w' of said split electrodes, satisfy the following requirements:

$0.5t \leq w' \leq 3t$ and $5w' \leq l \leq 30w'$.

10. A piezoelectric resonator according to claim 9, wherein a gap width between said two split electrodes is smaller than the width of said split electrodes.

11. A piezoelectric resonator resonating at a resonant frequency greater than 1 MHz comprising: a piezoelectric ceramic plate which is polarized in the same direction in the direction of thickness thereof, electrodes formed on the two opposing main surfaces of said piezoelectric ceramic plate, said electrode formed on one main surface being divided into two split electrodes, and said split electrodes receiving a signal for causing said piezoelectric ceramic plate to resonate beneath said split electrodes in a thickness dilatational mode with a phase difference of 180° at a resonant frequency greater than 1 MHz, the length l and thickness t of said piezoelectric ceramic plate, and the width w' said split electrodes satisfy the following requirements:

$0.5t \leq w' \leq 3t$ and $5w' \leq l \leq 30w'$, and a gap width between said two split electrodes is smaller than the width of said split electrodes, said gap width being about 0.2 times the width of said split electrodes.

12. A piezoelectric resonator according to any one of claims 1 to 11, wherein said piezoelectric ceramic plate is made of a PbTiO$_3$-type ceramic material composed chiefly of PbO and TiO$_2$.

13. A piezoelectric resonator according to claim 12, wherein said piezoelectric ceramic plate is made of a piezoelectric ceramic composition which comprises 43.7 to 46.3 mole % of PbO, 50.4 to 52.6 mole % of TiO$_2$, 1.8 to 3.2 mole % of at least one oxide selected from the group consisting of Nd$_2$O$_3$, Sm$_2$O$_3$, Pr$_2$O$_{11/3}$ and Ce$_2$O$_4$, and 0.5 to 1.5 mole % of MnO$_2$.

14. A piezoelectric resonator resonating at a resonant frequency greater than 1 MHz comprising: a piezoelectric ceramic plate in the form of a solid non-apertured member which is polarized in the same direction in the direction of thickness thereof electrodes formed on the two opposing main surfaces of said piezoelectric ceramic plate, said electrode formed on one main surface being divided into two split electrodes, and a support member disposed at only one end of said piezoelectric ceramic plate for supporting said piezoelectric ceramic plate thereat, said split electrodes receiving a signal for causing said piezoelectric ceramic plate to resonate beneath and split electrodes in a thickness dilatational mode with a phase difference of 180° at a resonant frequency greater than 1 MHz so that spurious signals caused by undesired vibrations are cancelled by each other.

15. A piezoelectric resonator according to claim 14, wherein the length l and thickness t of said piezoelectric ceramic plate, and the width w' of said split electrodes, satisfy the requirements:

$0.5t \leq w' \leq 3t$ and $5w' \leq l \leq 30w'$.

16. A piezoelectric resonator according to claim 1, 15, wherein said piezoelectric ceramic plate is a solid non-apertured member, a portion of said piezoelectric ceramic plate beneath one of said split electrodes being expanded in the thickness direction of said piezoelectric ceramic plate while a portion of said piezoelectric ceramic plate beneath another one of said split electrodes is contracted in the thickness direction of said piezoelectric ceramic plate so that said piezoelectric ceramic plate resonates beneath said split electrodes at a resonant frequency greater than 1 MHz, and a support member being disposed at only one end of said piezoelectric ceramic plate for supporting said piezoelectric ceramic plate thereat.

* * * * *